United States Patent
Honda et al.

(10) Patent No.: US 11,295,993 B2
(45) Date of Patent: Apr. 5, 2022

(54) MAINTENANCE SCHEDULING FOR SEMICONDUCTOR MANUFACTURING EQUIPMENT

(71) Applicant: PDF Solutions, Inc., San Jose, CA (US)

(72) Inventors: Tomonori Honda, Santa Clara, CA (US); Jeffrey Drue David, San Jose, CA (US); Lin Lee Cheong, San Jose, CA (US)

(73) Assignee: PDF Solutions, Inc., San Jose, CA (US)

( * ) Notice: Subject to any disclaimer, the term of this patent is extended or adjusted under 35 U.S.C. 154(b) by 0 days.

(21) Appl. No.: 17/002,250

(22) Filed: Aug. 25, 2020

(65) Prior Publication Data

US 2020/0388545 A1 Dec. 10, 2020

Related U.S. Application Data

(63) Continuation of application No. 16/365,538, filed on Mar. 26, 2019, now Pat. No. 10,777,470.

(60) Provisional application No. 62/648,864, filed on Mar. 27, 2018, provisional application No. 62/650,173, filed on Mar. 29, 2018.

(51) Int. Cl.
*G06F 11/22* (2006.01)
*G06F 7/50* (2006.01)
*H01L 21/66* (2006.01)
*G06N 20/00* (2019.01)
*G01R 31/26* (2020.01)

(52) U.S. Cl.
CPC .......... *H01L 22/10* (2013.01); *G01R 31/2601* (2013.01); *G06N 20/00* (2019.01)

(58) Field of Classification Search
USPC .................... 716/51, 52, 136, 132
See application file for complete search history.

(56) References Cited

U.S. PATENT DOCUMENTS

| | | | |
|---|---|---|---|
| 3,751,647 A | 8/1973 | Maeder et al. | |
| 5,793,650 A | 8/1998 | Mirza | |
| 5,923,553 A | 7/1999 | Yi | |
| 6,509,197 B1 * | 1/2003 | Satya | G01N 21/66 257/E23.179 |
| 6,610,550 B1 | 8/2003 | Pasadyn et al. | |
| 6,614,540 B1 * | 9/2003 | Stirton | G01B 11/303 356/237.1 |
| 6,751,519 B1 | 6/2004 | Satya | |
| 6,772,034 B1 * | 8/2004 | Shi | G05B 19/4188 700/121 |
| 6,819,426 B2 | 11/2004 | Sezginer et al. | |

(Continued)

FOREIGN PATENT DOCUMENTS

CN 101738991 B 9/2014

OTHER PUBLICATIONS

Pilsung Kang et al., 'Virtual Metrology for Run-to-Run Control in Semiconductor Manufacturing', 2011, vol. 38, pp. 2508-2522, Elsevier, Expert Systems with Application.

(Continued)

*Primary Examiner* — Brian Ngo
(74) *Attorney, Agent, or Firm* — Dergosits & Noah LLP

(57) ABSTRACT

A maintenance tool for semiconductor process equipment and components. Sensor data is evaluated by machine learning tools to determine when to schedule maintenance action.

20 Claims, 2 Drawing Sheets

(56) References Cited

U.S. PATENT DOCUMENTS

| | | | |
|---|---|---|---|
| 6,839,713 B1* | 1/2005 | Shi | G06Q 10/06 |
| 6,968,253 B2 | 11/2005 | Mack et al. | |
| 7,117,057 B1 | 10/2006 | Kuo et al. | |
| 7,184,853 B2 | 2/2007 | Roberts et al. | |
| 7,289,214 B1 | 10/2007 | Li et al. | |
| 7,403,832 B2 | 7/2008 | Schulze et al. | |
| 7,581,140 B1* | 8/2009 | Pasadyn | G05B 19/41875 714/37 |
| 7,842,442 B2 | 11/2010 | Seltmann et al. | |
| 7,873,585 B2 | 1/2011 | Izikson | |
| 7,957,826 B2 | 6/2011 | Ausschinitt et al. | |
| 8,233,494 B2 | 7/2012 | Amini et al. | |
| 8,339,595 B2 | 12/2012 | Den Boef | |
| 9,002,498 B2 | 4/2015 | Chang | |
| 9,087,176 B1 | 7/2015 | Chang et al. | |
| 9,116,442 B2 | 8/2015 | Adel et al. | |
| 2003/0014145 A1 | 1/2003 | Reiss et al. | |
| 2003/0074639 A1 | 4/2003 | Park et al. | |
| 2003/0229410 A1 | 12/2003 | Smith et al. | |
| 2004/0167655 A1 | 8/2004 | Middlebrooks et al. | |
| 2004/0181728 A1 | 9/2004 | Pellegrini | |
| 2004/0233439 A1 | 11/2004 | Mieher | |
| 2008/0057418 A1 | 3/2008 | Seltmann | |
| 2008/0262769 A1 | 10/2008 | Kadosh et al. | |
| 2008/0275586 A1 | 11/2008 | Ko et al. | |
| 2010/0321654 A1 | 12/2010 | Den Boef | |
| 2013/0054186 A1 | 2/2013 | Den Boef | |
| 2013/0060354 A1 | 3/2013 | Choi et al. | |
| 2013/0110276 A1 | 5/2013 | Cheng et al. | |
| 2013/0208279 A1 | 8/2013 | Smith | |
| 2013/0230797 A1 | 9/2013 | Van Der Sanden | |
| 2013/0282340 A1 | 10/2013 | Liu et al. | |
| 2013/0310966 A1 | 11/2013 | MacNaughton et al. | |
| 2014/0094015 A1 | 4/2014 | Kasa | |
| 2014/0362363 A1 | 12/2014 | Cai | |
| 2015/0253373 A1 | 9/2015 | Callegari et al. | |
| 2015/0369857 A1* | 12/2015 | Nakamura | H01L 24/95 438/15 |
| 2016/0300338 A1* | 10/2016 | Zafar | G06K 9/6201 |
| 2017/0023927 A1* | 1/2017 | Kaushal | G05B 19/4065 |
| 2018/0337792 A1* | 11/2018 | Brink | H01L 39/223 |
| 2019/0186909 A1* | 6/2019 | Mack | G06T 7/13 |

OTHER PUBLICATIONS

William H. Arnold, Towards 3nm Overlay and Critical Dimension Uniformity: An Integrated Error Budget for Double Patterning Lithography', 2008, SPIE vol. 6924, Optical Microlithography XXI, pp. 1-9.

Prasad Dasari, Jie Li, Jiangtao Hu, Nigel Smith and Oleg Kritsun (2011). Diffraction Based Overlay Metrology for Double Patterning Technologies, Recent Advances in Nanofabrication Techniques and Applications, Prof. Bo Cui (Ed.), ISBN: 978-953-307-602-7, InTech, Available from: http://www.intechopen.com/books/recentadvances-in-nanofabrication-techniques-and-applications/diffraction-based-overlay-metrology-for-doublepatterning-technologies.

Peter M. O'Neili et al., 'Statistical Test: A New Paradigm To Improve Test Effectiveness & Efficiency', 2007, pp. 1-10, IEEE International Test Conference. ISBN: 1-4244-1128-9/07.

Ajay Khochel et al., 'A Tutorial on STDF Fail Datalog Standard', 2008, pp. 1-10, IEEE International Test Conference, ISBN: 1-4244-4203-0/08.

Raphael Robertazzi et al., 'New Tools and Methodology for Advanced Parametric and Defect Structure Test', 2010, pp. 1-10, IEEE International Test Conference, ISBN: 978-1-4244-7207-9/10.

Shane A. Lynn, 'Real-Time Virtual Metrology and Control of Etch Rate in an Industrial Plasma Chamber', pp. 1-6; Part of 2012 IEEE Multi-Conference on Systems and Control; Oct. 3-5, 2012. Dubrovnik, Croatia 2012 IEEE International Conference on Control Applications (CCA).

Rao Desineni et al., 'The Grand Pareto: A Methodology for Identifying and Quantifying Yield Detractors in Volume Semiconductor Manufacturing', May 2, 2007, pp. 87-100, vol. 20, IEEE Transactions on Semiconductor Manufacturing.

Pieter Kneilssen et al., Powerpoint Presentation titled 'Litho InSight, a novel approach towards on-product litho performance improvement'; 31 pages, APC Conference XXVI in Ann Arbor, Michigan.

John C. Robinson, Ph.D., 'Intelligent Feed-forward of Non-Litho Errors for 3D Patterning', 20 pages, Sep. 30, 2014, APC Conference XXVI in Ann Arbor, Michigan.

Michael Hackerott, 'Semiconductor Manufacturing and Engineering Data Analysis', 38 pages.

Prasad Dasari et al, 'A Comparison of Advanced Overlay Technologies', 9 pages, 2010, vol. 7638, Metrology, Inspection, and Process Control for Microlithography XXIV, ccc Code: 0277-786X/10, doi: 10.1117/12.848189.

Daewoong An et al., 'A Semiconductor Yields Prediction Using Stepwise Support Vector Machine', Nov. 17-20, 2009, Proceedings of 2009 IEEE International Symposium on Assembly and Manufacturing In Suwon Korea, 7 pages.

Sae-Rom Pak et al., 'Yield Prediction using Support Vectors Based Under-Sampling in Semiconductor Process', pp. 896-900, Dec. 20, 2012, International Scholarly and Scientific Research & Innovation vol. 6, World Academy of Science, Engineering and Technology.

International Search Report and Written Opinion for PCT Application No. PCT/US2015//062693; dated Feb. 9, 2016.

* cited by examiner

MAINTENANCE SCHEDULING FOR SEMICONDUCTOR MANUFACTURING EQUIPMENT

CROSS REFERENCE

This application is a continuation of U.S. application Ser. No. 16/365,538 entitled Selective Inclusion/Exclusion of Semiconductor Chips in Accelerated Failure Tests; and claims priority from U.S. Provisional App. Nos. 62/648,864 and 62/650,173; and the disclosure of each of those applications is incorporated herein by reference.

TECHNICAL FIELD

This disclosure relates generally to semiconductor manufacturing processes, and more particularly, to systems and methods for using semiconductor testing data to determine a failure propensity for downstream tests, and also for using sensor data to schedule condition-based maintenance of components used in semiconductor fabrication equipment.

BACKGROUND

The manufacture of semiconductor integrated circuit chips remains a complex and demanding business, and it continues to rapidly evolve with major changes in device architectures and process technologies. One constant has been testing at each stage of production to ensure that chip quality remains within acceptable limits.

Data from chip testing can be utilized by passing it through a set of engineering rules to decide whether to discard, ship, or further test the chip under consideration. This approach, based primarily on the intuition of test engineers, was adequate in previous device nodes for three reasons. (1) The physical dimensions of the devices were far from the limitations imposed by the materials and the manufacturing process. Thus, the reliability was generally high even if the engineering rules governing the pass/fail decisions were noisy. (2) The tests themselves were simpler in terms of number of the parameters tested. (3) Less complexity in chip design relative to modern day layouts. As a result, test engineers could use their subject-matter expertise to formulate the pass/fail rules with high accuracy.

However, modern chip manufacturing, with process improvements that result in smaller features, tighter tolerances and higher density, increasingly pushes the physical limits of such tests. Reliability concerns with semiconductor equipment performance as well as improvements in the testing space have resulted in both an increase in number of tests performed as well as an increase in the amount of information obtained per test. Frequently, there are interactions between parameters that are difficult for human experts to uncover by inspection.

Machine Learning ("ML") algorithms have become popular for use with semiconductor manufacturing processes precisely because they are able to uncover multivariate relationships among data and parameters thereby enhancing the ability to monitor and control the chip production process. Generally, an ML model can be constructed for a specific process parameter by sampling relevant data in order to build one or more training sets of data to represent expected performance of the process with regard to that parameter.

One of the areas of testing that could improve is the determination that a chip in current production is good quality and can proceed, or is bad quality and should be rejected, or is somewhere between good and bad quality and should be subject to further testing. Of course, the determination that a chip is bad or requires further testing has significant cost implications, including the fact that further testing can be fatally harmful to the device.

Therefore, it would be desirable to be effectively filter the chips to exclude those chips that do not require further testing. In this disclosure, an ML model is created using the testing data in order to include or exclude certain chips from further failure testing.

Another area for improvement is the operation, maintenance, repair and replacement of process equipment. For example, it would be desirable to schedule actions such as repairing or replacing a sensor or other process equipment when indicated by sensor data rather than on a fixed schedule, and an ML model is created to do so.

DETAILED DESCRIPTION

1. Introduction

A system and method are described for using semiconductor testing data to selectively filter out low-risk chips and include high-risk chips in expensive and (potentially detrimental) stress testing steps. The stress testing can include but is not limited to accelerated failure tests that employ high-temperature, high pressure, humidity, radiation, or high voltage testing. Extreme-environment testing is most commonly used for chips deployed in demanding applications including automotive, natural resource extraction, military, space, and power electronics.

2. Overview of Semiconductor Manufacturing Process and Data

Data has always played an important role in semiconductor and electronics manufacturing. Data was initially collected manually to track work-in-progress (WIP), and the types of data collected included metrology data (measurements taken throughout the IC fabrication process), parametric test data, die test data, final test data, defect data, process data, and equipment data. Standard statistical and process control techniques were used to analyze the datasets to improve yields and manufacturing efficiencies. In many instances, the analysis was performed in a manual "ad-hoc" fashion by domain experts.

However, as device nodes became smaller and tolerances became tighter, factories became more automated and the ability to detect and collect data improved. Indeed, the volume and velocity of data collection continues to increase rapidly as more sensors and other types of measurement devices continue to be deployed throughout the semiconductor manufacturing process.

Given the massive amount of sensor data now collected, and the relatively low retention rates of the data, advancements in data science could and should be implemented to solve the problems of the semiconductor industry. Some progress has been made to leverage data to improve efficiencies in the semiconductor and electronics industries. For example, microchip fabrication factories are combining and analyzing data to predict when a tool for a particular process needs maintenance, or to optimize throughput in the fab.

Figure 1:
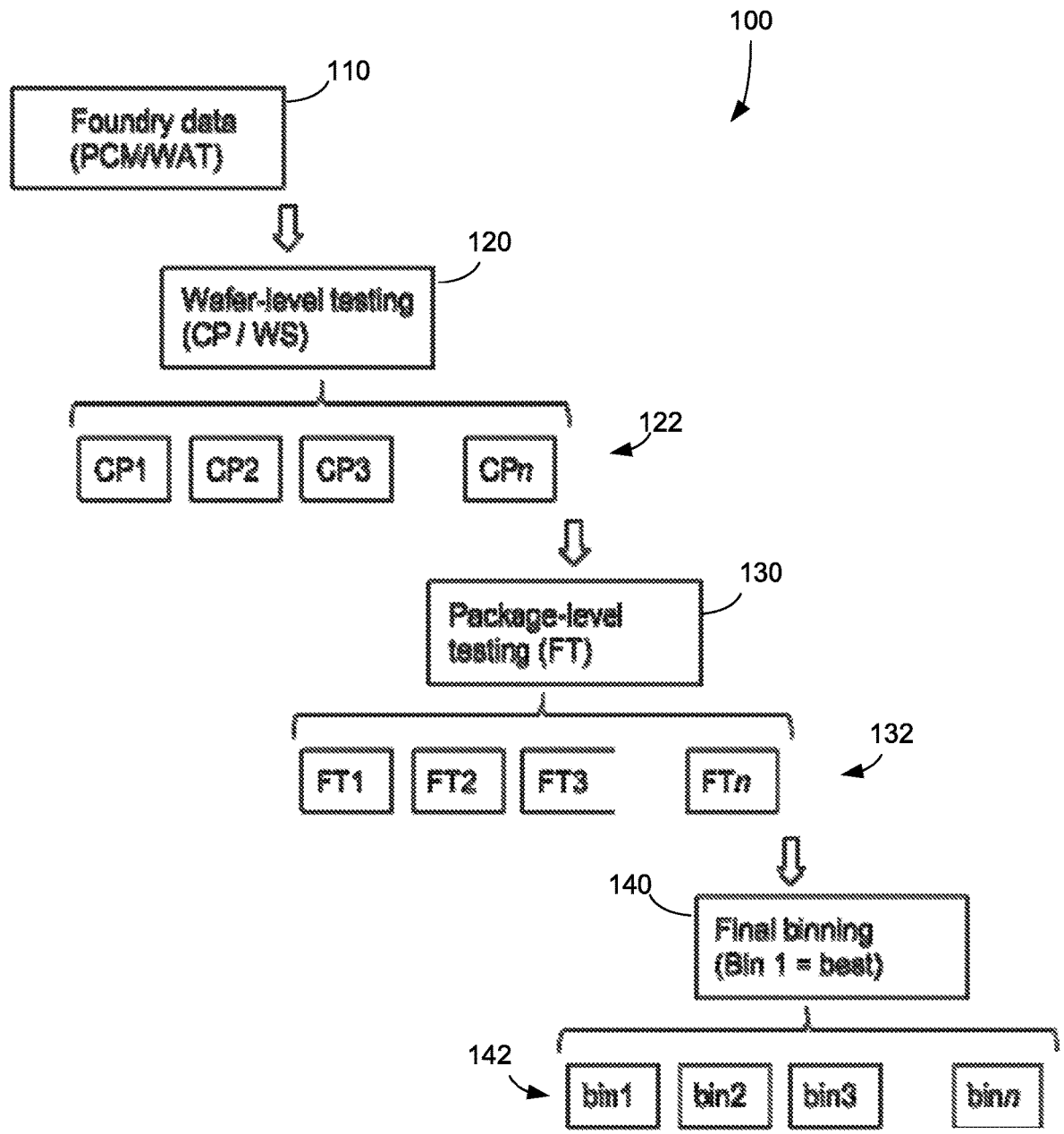
FIG. 1 is a block diagram illustrating testing points at different stages of a semiconductor manufacturing process.

FIG. 1 illustrates one possible flow 100 of testing steps for semiconductor chips between manufacture and eventual shipment of the chips. At the processing facility, e.g., the foundry, multi-point testing is performed at step 110 on each wafer before shipping the processed wafers on to chip manufacture. The data collected at the foundry testing step 110 is commonly called Wafer Acceptance Testing (WAT) data or Process Control Monitoring (PCM) data.

After processed wafer lots leave the foundry, each chip on the still-unbroken wafer is tested for defects at step 120 upon receipt at the chip manufacturing facility. The data collected during testing step 120 is commonly called Circuit Probe (CP) data or Wafer Sort (WS) data. The data gathering at this stage may be performed in a single testing step or it may be broken into multiple testing steps. In the latter case, multiple datasets 122 labeled as CP1, CP2 ... CPn for the respective testing sets will need to be combined for proper analysis.

At the chip manufacturing facility, the wafer is broken into individual chips and packaged for shipping. A final set of tests is performed on the packaged chips in step 130. The data gathered during testing step 130 is called the Final Test (FT) data. As with testing step 120, the data gathering in testing step 130 may be collected in multiple datasets 132 labeled as FT1, FT2 ... FTn, which are combined for analysis.

In some cases, there is also a systems level test (SLT) on chips post-packaging in step 140. In this testing step 140, the finished products are assigned to different "bins" 142 labeled as bin1, bin2 ... binn according to a quality determination, where bin1 is determined to be the "best" quality finished product and binn is determined to be the "poorest" quality finished product.

3. Machine Learning Generally

The semiconductor industry presents some unique challenges for applying predictive analytics and machine learning algorithms. Some of these challenges include: nonlinearity in most batch processes; multimodal batch trajectories due to product mix; process drift and shift; small amount of training data; and process steps with variable durations (often deliberately adjusted).

A good understanding of these challenges is needed to properly employ predictive analytics. If applied properly, predictive analytics can find complex correlations that may have been difficult to uncover using other techniques. This new access to deeper understanding and insight can then be leveraged to increase yield, improve device performance, and reduce costs.

Machine Learning ("ML") is a subset of Artificial intelligence ("AI") and is located at the intersection of Statistics and Computer Science. ML/AI have been developed to analyze large volumes of data and automatically generate rules that help make pass/fail recommendations. Such recommendations can increase in accuracy with the volume of data analyzed. Moreover, by retraining the ML models, the recommendations can adapt to the latest distribution of the data. A human expert or a previously-deployed rule-based system can make the ultimate decision until (1) a desired level of accuracy is achieved, or (2) a desired level of confidence is reached for the ability of the ML model.

ML/AI is particularly useful for analysis of modern chip test data due to its ability to uncover nonlinear interactions in highly multidimensional test data, as well as identify tests that are important in predicting eventual chip outcomes. The ML/AI-based approach requires an effective integration of semiconductor domain knowledge with core statistical algorithms. This process, known as feature engineering and feature selection, is critical for the success of the approach. The ML/AI approach is sensitive to the quality of the data and can be computationally intensive. In addition to feature engineering, careful attention must therefore be paid to the statistical robustness of the results and to effective parallelization of the computational process.

The primary utility for this system, also known as Smart Testing (ST) (previously known as Test Avoidance), is to advise test engineers on the probability that a chip will fail a stress test. The most common stress test utilized is the final stress test, as applying this test to a chip takes time, is costly, and is potentially detrimental to a chip. A common example of a stress test is burn-in. Smart Testing aims to identify incoming chips that would likely pass these stress tests and recommend that the identified chips skip the test altogether, resulting in substantial savings in cost and time.

Additionally, when chips are destined for safety-minded applications, such as automotive, it is very important for the system to correctly identify the chips that could possibly fail such tests. This use case differs from the standard ML/AI problem whereby one aims to achieve as high an accuracy rate as possible and an optimized number of false negatives (that is, recommending a failing chip to skip test) are tolerated. Instead, the false negative rate is a set as a hard requirement (usually tied to a specification whereby all chips are sent for tests) and the ML/AI algorithm strives to achieve maximum skip rate while adhering to the pre-specified number of false negatives. This amount is typically in a low count of parts per million, and thus for lower amounts of chips (such as a few hundred thousand chips) the allowed number of false negatives is effectively zero.

Predictive analytics and ML/AI algorithms can thus be used to address many of the challenges facing the semiconductor industry. By drilling deeper into the details of semiconductor manufacturing and knowing how to apply predictive analytics to detect and resolve process issues faster, and to tighten and target the specifications of individual manufacturing steps, increased process efficiencies can result. Some of the known ML algorithms include but are not limited to: (i) a robust linear regression algorithm, such as Random Sample Consensus (RANSAC), Huber Regression, or Theil-Sen Estimator; (ii) a tree-based algorithm, such as Classification and Regression Tree (CART), Random Forest, Extra Tree, Gradient Boost Machine, or Alternating Model Tree; (iii) a neural net based algorithm, such as Artificial Neural Network (ANN), Restricted Boltzmann Machine (RBM), Deep Learning; (iv) kernel based approach like a Support Vector Machine (SVM) and Kernel Ridge Regression (KRR); (v) neighborhood-based approach like a K-Nearest Neighbors (KNN); and others.

In one example, machine learning algorithms can be used to predict when a fault or defect will occur in the manufacturing process or on a specific tool at a process step. Identifying a machine fault or failure, and finding the root cause of faults quickly can be essential in semiconductor manufacturing. If faults in the manufacturing process can be better detected and resolved, downtime and scrap can be reduced. This is also referred to as fault detection and classification (FDC). If faults can be predicted before they occur, then downtime can be optimally scheduled and scrap can be even further reduced. As an example, decision trees can be used to determine which input features can best predict a fault in a process, and develop decision rules around detecting a fault.

Some earlier efforts of the applicant are described in the following publications, each of which is incorporated herein in its entirety: U.S. Publication No. 2016/0148850 entitled Process Control Techniques for Semiconductor Manufacturing Processes; U.S. Publication No. 2017/0109646 entitled Process Control Techniques for Semiconductor Manufacturing Processes; U.S. Publication No. 2018/0358271 entitled Process Control Techniques for Semiconductor Manufacturing Processes; U.S. Publication No. 2018/0356807 entitled Generating Robust Machine Learning Predictions for Semiconductor Manufacturing Processes; and U.S. Publication No. 2019/0064253 entitled Semiconductor Yield Prediction.

4. Machine Learning System for Filtering Chips

Figure 2:
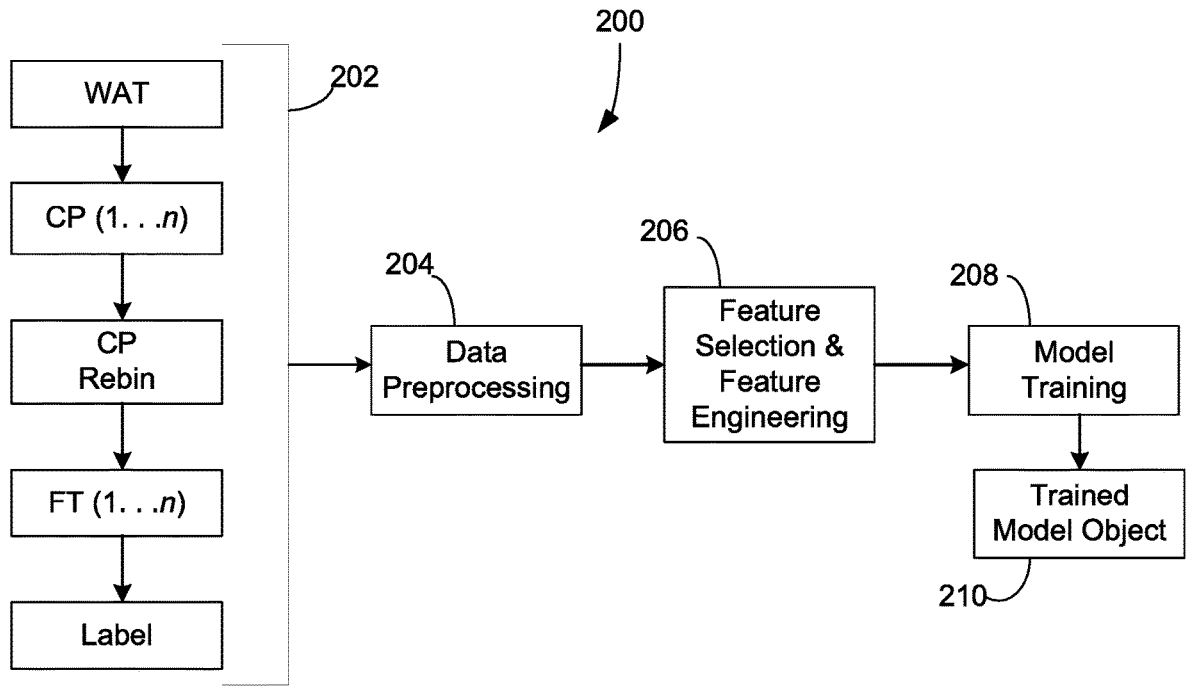
FIG. 2 is a flow chart illustrating a process for training an ML model.
Figure 3:
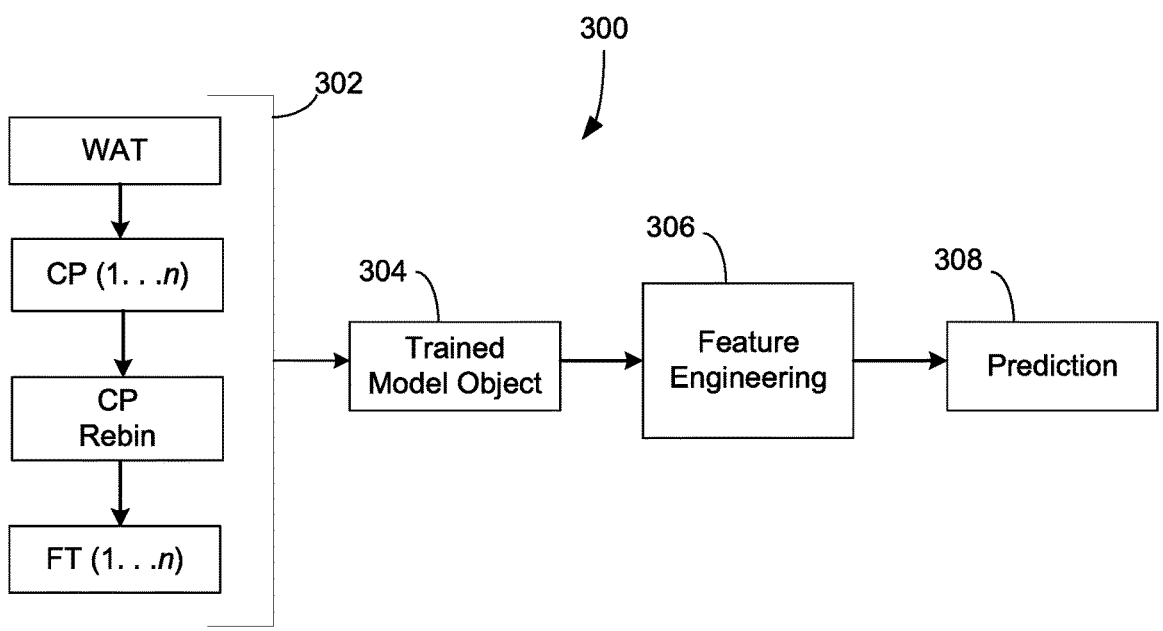
FIG. 3 is a flow chart illustrating a process for using the trained ML model to make a prediction.

Any machine learning model is created using a two-step process: training and prediction. In this case, the training process 200 is illustrated in FIG. 2 and the prediction process 300 is illustrated in FIG. 3.

The training process 200 includes obtaining in step 202 historical data from the different stages of the semiconductor process, such WAT data, CP data, CP re-bin data, and FT data, as well as labelling or bin data (chip pass/fail). In step 204, the data is preprocessed, for example, to remove data from chips in progress (since not all required testing has been completed); to combine and merge data from disparate tests; to validate the data; to remove data having known issues (blacklisted) or that are otherwise not representative of actual production (such as developmental experiments); to perform statistical and anomaly detection on selected features. In step 206, feature selection and feature engineering are performed. For example, indicator variables can be created to note whether a particular observation contains null values, and features can be selected based on the amount of information contained in the feature and/or its correlation relative to the desired target (defective/non-defective).

In step 208, an appropriate training algorithm is run on the processed data to train the model. Labelling data can be provided separately by the customer or it may be derived from one of the data inputs (e.g., the bin number from a particular FT). Not all data listed above are required.

The output of the training step 208 is a trained model object in step 210. The model object can be a self-contained, executable binary object capable of receiving production data and making predictions. The training step can also provide an option to deploy the trained model object to a chosen location (such as a pre-production or a production system).

The prediction process 300 obtains current WAT, CP, CP re-bin and FT data from the production run in step 302, then feeds the data into the trained model object in step 304. Feature engineering is performed in step 306, and a prediction is made in step 308.

The trained model can output a wafer-map with recommendations (plus optionally a confidence score) for chips to be sent to specified test step (usually burn-in) or to be shipped without specified test. The output, in the form of recommendations, can be provided in various formats, such as CSV files, or ingested directly into customer database systems.

5. System Components

In one embodiment, the machine learning system disclosed herein includes following components or modules: (A) data inputs; (B) input data validation (optional); (C) anomaly detection on input data; (D) feature engineering and feature selection; I model training and deployment; (F) training workflow management GUI (optional); (G) prediction; (H) visualization of training and prediction results (optional); and (I) excursion handling.

C. Data Inputs

The training step can require some or all of the following types of data: WAT (or PCM) data, supplied by the foundry; CP (or WS) wafer-level testing data; CP rebin data; FT, post-packaging, chip-level testing data; SLT data; and labelling information (chip pass/fail).

The prediction step can require the same data, except for the labelling information.

Data inputs can be made available through a variety of methods, including but not limited to: direct ingestion of CSV files in specified file location, and extraction from relational, or NoSQL, or Big-Data database.

B. Input Data Validation

Validation of input data can be performed at two levels: structural validation and statistical validation. The use of one or both validation methods is dependent on customer needs.

Structural validation refers to checking the consistency between the agreed-upon schema and the actual schema of the latest batch of the training and the prediction data. For data input carried out using direct database access, many of the structural checks become unnecessary (with the possible exceptions of string pattern and time format checks) since the database can perform some of these validity checks during the data ingestion step.

In some cases, when the input features are known to vary from week to week, a dynamic schema can be applied, and structural validation will be limited to a small number of pre-defined "must-have" data columns.

Statistical validation refers to checking the content of the data. Statistical validation is typically carried out on numeric data, but it could also be carried out on categorical or string data types. Specifically, the following are some examples of statistical validations can be included in the disclosed system (non-exhaustive list): comparison of common statistical quantities against predefined limits; use of minimum, maximum, average, standard deviation, percentiles, correlations; support for adding checks for user-defined quantities; uniqueness checks for categorical and string data types (e.g. lot ids, wafer ids, ECIDs); check for date and time-stamp validity (e.g. does the CPC date match with WAT); checks for statistical distribution of the fresh data against historical values; among others.

C. Anomaly Detection

Anomaly detection can be implemented as a statistical scoring technique that is designed to flag data points that are atypical. Anomaly detection techniques can be included as part of either statistical data validation or model training. The proper choice would depend on the problem being solved by anomaly detection. If the purpose is to separate anomalous input rows prior to training on regular inputs, then it can be reasonable to include anomaly detection under statistical validations. If the anomalous points themselves are of interest. Then it may be more appropriate to include the anomaly detection under model training.

In one embodiment, the disclosed filter system comes with built-in anomaly detection features which can be activated based on a statistical measure of the distribution of input data.

The physical/electrical testing of the data is an inherently noisy process. Furthermore, engineers typically denote open circuits and shorts in the form of extreme values. Direct use of this data as features would likely result in a significant skew of descriptive statistics such as mean and variance. Thus, an outlier detection method can identify and correctly label these anomalies, including but not limited to: statistical methods such as labelling data as outliers that are beyond mean plus three standard deviations, or beyond a certain percentile, as well as ML algorithms such as local outlier factor, isolation forests, and DBSCAN. The identification of the outliers can then be utilized during feature engineering and feature selection.

D. Feature Engineering and Feature Selection

Outliers in the previous step can be used to create new indicator variables, as well as features that contain missing values. The observations in the original variable that were identified as outliers, can also be replaced with values such as upper value, lower value, or median value as a form of data truncation and replacement.

Similar tests may be applied at multiple sites within a single chip. These features can be grouped together to compute aggregate statistics such as mean and standard deviation. If the relationship between different features is not known, natural language processing (NLP) of the feature names can be applied to group features without prior knowledge. Additional requirements can be applied to ensure that only the truly related features are grouped together and include but are not limited to ensuring that the grouped features have high a correlation, and undergo statistical tests for mean and variance to have high confidence that the features should be grouped together. Additionally, aggregated statistics per wafer can be applied and used to create new features.

The conditional nature of some of the tests will yield results having null values, and the feature and indicator variables can possibly move in tandem. This can potentially result in numerical instability in models and these type of results should be grouped together.

As the number of tests increase, the number of features for model training increases drastically. Thus, feature selection can be used to filter and identify features that contain information that can be used by the machine learning algorithm. This can include univariate feature selection via statistical testing including but not limited to: 1) distribution tests such as Kolgomorov-Smirnov (KS) tests, 2) statistical tests such as significance testing for mean and variances, and information theory testing such as testing for area under curve (AUC), as well as multivariate feature selection, whereby redundant and low-information features can be safely eliminated or combined.

E. Model Training

Model training is usually the most computationally intensive step. As described earlier, the inputs to the model training steps are the WAT data, the CP data and the FT data. The output of the model training step can be an executable trained model object to be used as is in the prediction step. Model training can be triggered either manually by the user or on a user-defined time interval.

The low number of final chip failures results in a highly skewed classification problem. To address this issue, a multi-stage modeling approach can be applied, namely, relabeling models, and final models C. Method 1:

In the first stage, one or more models can be used to relabel training dataset and reduce skew. These relabeling models, preferably different from those used in the final models, are used to determine segments/observations in the training dataset that are adjacent (or most similar) to the true defects in the feature space and represent 'marginally' passing chips. With multiple models, a voting scheme can be applied whereby a certain number (such as majority) of models have to agree to relabel an observation. Alternatively, a fixed ratio of observations can be chosen to be relabeled as defective.

In the second stage, one or more models can be used to train a final model with the relabeled dataset, along with established data science techniques such as cross-validation, up-sampling, weights and hyper-parameter tuning. Furthermore, weights of the relabeled observations as well as the true defects can be applied, based on the confidence of the first stage model.

ii. Method 2:

An alternate approach to the relabeling method would be to deploy step-wise models that corresponds to each testing step for the first stage model. For each step (e.g. FT1, FT2), a model can be trained against whether the chip passes or fails that particular step (as opposed to the final test step) to address the data skew issue.

The probabilities whether that particular chip passes a certain step are then used in the second stage model to determine whether the chip will likely fail final test.

In both approaches, a probability of failure is predicted for each chip and a probability threshold applied to decide which chips to send for further testing. This threshold will be customer specified, primarily as dependent on risk appetite and cost reduction considerations.

The trained model object is then created and is ready for deployment. All the pertinent information required for prediction on new chips will be contained in this object, including but not limited to selected features and grouping, imputation methods and information on how to impute each of the features, and probability thresholds.

F. Workflow Management GUI (Optional)

Workflow can refer to how an end-user (e.g., in-house test engineer) interacts with the disclosed system to produce training model objects and review results. This includes performing the data input, validation, training, testing and model deployment steps. The disclosed system can come with a UI to help the end-user through these various steps, via a predetermined web address.

Through configuration of the GUI, customers can elect to have a customer-driven workflow (initiated by customer) or a workflow determined by an automated scheduler. Errors and notifications can be displayed and used to inform/guide user. Summary and model performances can be made available for user to review and select the best model for deployment in the customer-driven workflow. Chip failures are identified for customer to review and inform system of the validity of the identified chip failures.

G. Prediction

The prediction step can use the WAT and CP data from production in conjunction with the deployed model object generated in the model training step to produce a wafer-map of predictions. Predictions in this context refer to recommendations (with confidence score) as to whether to send a given chip for final test/burn-in.

The deployed model object will contain all the pertinent information required to perform a prediction. This will include (i) sanity and statistical checks on the new incoming data, to ensure prediction quality and that model assumptions are not violated; (ii) feature engineering that was applied previously during model training, such as imputation, null value and aggregate statistical features; and (iii) probability thresholding.

The system can also include business intelligence actions based on customer needs and input data. For instance, if a required feature is missing from new data, the system can be specified to label all chips as needing testing or to automatically trigger model retraining with the reduced feature set. Additionally, warning and flags can be applied to inform the user when the chip skip rates have changed beyond certain preset values or when unusual behaviors are observed.

H. Scheduling

The deployment step merely transfers the model object to the chosen deployment environment, and does nothing with regard to periodic running of the prediction job (i.e. scheduling). Scheduling of the system can be handled separately on the target environments. This typically involves using standard Linux-based scheduling tools like the CRON, Anacron, and Systemd to invoke a static symbolic link that points to a model object. The designated model object may be changed with every deployment event. As long as the symbolic link remains valid, the scheduler can successfully trigger the prediction run. The symbolic linking between the model object and the scheduler can be typically a one-time initialization task.

C. Excursion Handling and Notification

Excursions refer to deviations from the specifications during the automatic prediction step. The excursions can occur at the system, data or the statistical levels. Common system excursions can include inaccessible databases or services, deleted or inaccessible libraries, and unexpected change of operating system or language versions. Common data excursions can include missing data files, corrupt or incomplete data, and mismatched types. Common statistical excursions can include out-of-range values, and abnormal change in shape of parameters of a distribution.

6. Maintenance Tool for Semiconductor Manufacturing Equipment

A current industry trend is to move from scheduled and corrective maintenance to Condition-Based Maintenance ("CBM"). Scheduled maintenance utilizes prior knowledge to create a fixed maintenance schedule for each tool/machine. However, this results in either a conservative maintenance schedule that requires unnecessary maintenance, or equipment failure in-between times of the scheduled maintenance. Corrective maintenance is ideal when the cost of random downtime caused by equipment is low. In semiconductor manufacturing, where wafers need to be manufactured without any downtime to meet the demand and keep costs down, cost of unplanned downtime is high. Thus, semiconductor manufacturing is the ideal application for condition-based maintenance where non-catastrophic failures are diagnosed and remaining useful life of equipment and/or its components are computed.

The main difficulty associated with condition-based maintenance for semiconductor equipment is the following: (i) data for developing diagnostic and prognostic tools are limited, (ii) algorithms must be insensitive to the manufacturing process and recipe changes, etc., and (iii) causation of bad wafers must distinguish between bad equipment and other causes (like bad wafers going into the equipment). In order to bypass these issues, one approach utilizes Active Learning Framework and other online learning techniques to improve the diagnostic capability as well as adjust to shifts in manufacturing processes and recipes.

Scheduled preventative maintenance has been the most common approach used by industry for a long time. Basically, it was assumed that operational reliability should be able to accurately determine the wear rate and expected life of components. However, it was shown that manufacturing variation significantly impacts the lifespan of the components. This has recently shifted the maintenance strategy from preventive maintenance toward condition-based maintenance. However, CBM has its own disadvantages, such as high cost (including design, hardware, and software costs) and increased system complexity. In order for CBM to replace the preventive maintenance plan for a particular application, the benefit added from "better" maintenance schedule must able to overcome this additional cost.

Described below is a basic approach for creating diagnostic and preventive maintenance tools for semiconductor manufacturing equipment.

C. Diagnostic Engine

A diagnostic engine can be created for semiconductor manufacturing equipment with limited data. In a traditional approach, the predictive model for diagnostics is built offline. This can require more extensive training data and a clearer understanding of the accuracy of the model.

C. Diagnostics from Physics-based Model

There are a number of physics-based models that could be used, such as SPICE (Simulation Program with Integrated Circuit Emphasis), Matlab for Simulink, Dymola for Modelica, etc. One nice aspect of the physics-based model is that it can require fewer measurements to obtain parameters. However, the model should be accurate enough to capture the impact of different failure modes. In order to utilize the physics-based model for diagnostics, the shift in the signals is measured after inducing the failure mode into these physics-based models. By comparing the actual measured signal with current data, the failure modes of manufacturing equipment can be diagnosed at earlier stages.

ii. Diagnostics Based on Data-Driven Model

For this approach, sensor measurements are gathered for different failure modes. From these data, the multi-class classification model can be built to determine failure modes. An anomaly detection model can also be created to detect "unknown" failure modes that haven't been seen before.

iii. Diagnostics Based on Hybrid Model

For this approach, the physics-based model can be utilized for aiding with feature engineering of the sensor measurement. Unlike a diagnostic approach based on purely physics-based model, this approach can just obtain "intuition" about how failure mode impacts sensor measurements. Thus, it may not obtain an actual threshold value from the physics-based model. By combining the knowledge obtained from the physics-based model, it can require less features for the data mining model and thus reducing likelihood for overfitting. By reducing the number of features used for the data mining model, it can also reduce amount of training data necessary. Note that the physics-based model should provide a realistic relationship between a sensor measurement and a failure mode to perform better than a purely data-driven model.

An adaptive diagnostic engine can extend the traditional diagnostic engine by adjusting the model as more data is collected. A key aspect of the Adaptive Learning Framework is deciding which set is critical for manual labeling. There are a few different data sets that can be beneficial for model tuning including: (i) false positive, (ii) false negative, and (iii) false classification. False positive samples can be obtained when some equipment is flagged as failed, but are actually working fine. False negative sample can be obtained when some equipment is flagged as working, but needed repair. Finally, false classification can be obtained when the root cause of the failure was flagged wrong. This information can be obtained without hindering the operation of the manufacturing line. Rather than retraining the model constantly from scratch, a more consistent prediction can be obtained by utilizing the Adaptive Learning Frameworks.

B. Prognostic Engine

The main idea behind the prognostic engine is to extend the current diagnostics into predicting when a particular component will fail in the future. The basic concept is that the reliability profile is combined with diagnostics to achieve prognostics. The reliability profile can be obtained using (i) prior knowledge of the component degradation modes (usually from an understanding of underlying physics), (ii) historical data (i.e., curve fitting from historical data), and (iii) hybrid approach by choosing a set of possible curves (which are determined from physics). Tools such as Particle Filter, Extended Kalman Filter, etc. can be used to aid with these curve fitting processes. After the most likely degradation profiles are fitted, key metrics like Remaining Useful Life (RUL) can be obtained.

C. Maintenance Scheduler

In the semiconductor industry, where it can be critical to reduce the downtime of the manufacturing line, it can be very useful to time the maintenance schedule for multiple components. Thus, a user-friendly system can be created to optimize the component maintenance. For this maintenance scheduler, components with less than X amount of time remaining before failures are listed. These components can be updated and users alert whenever new components meet RUL criterion. Whenever components are replaced, the state of the components can be obtained to feedback into the diagnostic engine for adaptive learning.

7. Conclusion

The foregoing written description is intended to enable one of ordinary skill to make and use the techniques described herein, but those of ordinary skill will understand that the description is not limiting and will also appreciate the existence of variations, combinations, and equivalents of the specific embodiments, methods, and examples described herein.

The invention claimed is:

1. A method, comprising:
collecting a first plurality of sensor measurements from a first plurality of sensors associated with a first component of semiconductor manufacturing equipment during regular production runs of the semiconductor manufacturing equipment;
determining a relationship between each of the first plurality of sensor measurements and each of a plurality of failure modes of the first component;
selecting a first subset of the first plurality of sensor measurements determined to be most indicative of a first failure mode of the plurality of failure modes based on the determined relationship;
selecting a second subset of the first plurality of sensor measurements determined to be most indicative of a second failure mode of the plurality of failure modes based on the determined relationship; and
evaluating a difference between the first and second subsets of the first plurality of sensor measurements in order to predict one of the plurality of failure modes of the first component.

2. The method of claim 1, further comprising:
predicting a remaining useful life of the first component based on the evaluation of the first and second subsets; and
scheduling maintenance of the first component when the predicted remaining useful life of the first component is less than a threshold value.

3. The method of claim 1, further comprising:
configuring a first model to perform the step of selecting flan corresponding subsets of the first plurality of sensor measurements; and
configuring a second model to perform the step of evaluating the corresponding subsets.

4. The method of claim 3, further comprising:
the first model is a physics-based model and the second model is a data-driven model.

5. The method of claim 4, further comprising:
the first model and the second model are implemented as machine learning models trained on historical sensor measurements.

6. The method of claim 4, the first model further comprising:
simulating a first failure mode of the first component and modeling a second plurality of sensor measurements from the first plurality of sensors as a result of the simulated first failure mode, each of the second plurality of sensor measurements corresponding to a respective one of a first plurality of sensor measurements;
measuring a plurality of signal shifts between respective ones of the first plurality of sensor measurements and corresponding ones of the second plurality of sensor measurements;
evaluating the plurality of signal shifts in order to determine the relationship between each of the first plurality of sensor measurements and the simulated first failure mode of the first component; and
selecting the first subset for of the first plurality of sensor measurements based on the relationship between each of the first plurality of sensor measurements and the simulated first failure mode exceeding a first threshold criteria indicative of the first failure mode.

7. The method of claim 3, further comprising:
adapting and tuning the first model and the second model as more sensor measurements are collected.

8. The method of claim 7, further comprising:
collecting additional data sets of sensor measurements that are beneficial for tuning the first model and the second model to recognize a false positive, a false negative, or a false classification; wherein the false positive results when the evaluation step identifies the first failure mode of the first component in error, the false negative results when the evaluation step fails to identify the second failure mode of the first component when present, and the false classification results when the evaluation step identifies a third failure mode of the first component but misidentifies a root cause of the third failure mode.

9. The method of claim 1, further comprising:
evaluating additional pluralities of sensor measurements, each of the additional pluralities of sensor measurements associated with one or more components of the semiconductor manufacturing equipment, in order to determine a relationship between each one of the pluralities of sensor measurements and each one of a plurality of failure modes associated with respective components;
for each of the plurality of failure modes associated with respective components, selecting a corresponding subset of the pluralities of sensor measurements determined to be most indicative of the failure mode for a respective component; and evaluating the corresponding subsets of sensor measurements to determine potential failure modes of each respective component.

10. The method of claim 4, the second model further comprising:
a classification model for classifying a plurality of known failure modes.

11. The method of claim 10, further comprising:
detecting an unknown failure mode;
classifying the unknown failure mode; and
adding the unknown failure mode to the classification model.

12. A method, comprising:
determining, using a physics-based model, a relationship between each of a first plurality of sensor measurements obtained from a first plurality of sensors associated with a first component of semiconductor manufacturing equipment and each of a plurality of failure modes of the first component;
selecting, using the physics-based model, a plurality of subsets of the first plurality of sensor measurements, each of the plurality of subsets selected to represent a corresponding one of the plurality of failure modes on the basis of the determined relationship of each of the first plurality of sensor measurements to the corresponding failure mode; and
evaluating, using a data-driven model, differences among the corresponding subsets of the first plurality of sensor measurements to diagnose one of the plurality of failure modes of the first component.

13. The method of claim 12, further comprising:
predicting a remaining useful life of the first component based on the evaluation of the corresponding subsets; and
scheduling maintenance of the first component when the remaining useful life of the first component is less than a threshold value.

14. The method of claim 12, further comprising:
the relationship between each of the first plurality of sensor measurements and each of the plurality of failure modes is determined by inducing a first failure mode in the first component and comparing shifts in the sensor measurements of the corresponding subset.

15. The method of claim 14, further comprising:
for each of the plurality of failure modes, the corresponding subset is selected based on the impact the failure mode has on the sensor measurements.

16. The method of claim 14, further comprising:
for each of the plurality of failure modes, the corresponding subset is selected based on the relationship exceeding a first threshold criteria indicative of the first failure mode.

17. The method of claim 12, further comprising:
evaluating additional pluralities of sensor measurements, each of the additional pluralities of sensor measurements associated with one or more components of the semiconductor manufacturing equipment, in order to determine a relationship between each one of the pluralities of sensor measurements and each one of a plurality of failure modes associated with respective components;
for each of the plurality of failure modes associated with respective components, selecting a corresponding subset of the pluralities of sensor measurements determined to be most indicative of the failure mode for a respective component; and
evaluating the corresponding subsets of sensor measurements to diagnose one of the plurality of failure modes of each respective component.

18. A method, comprising:
using a physics-based model for feature engineering of sensor measurement data to select a subset of the sensor measurement data to represent a failure mode of a semiconductor manufacturing component; and
using a data-driven model to evaluate the subset of sensor measurement data to diagnose the failure mode.

19. A diagnostic engine for components of semiconductor manufacturing equipment, comprising:
a physics-based model configured to (i) evaluate a first plurality of sensor measurements associated with a first component of semiconductor manufacturing equipment; (ii) determine, based on the evaluation, a relationship between each of the plurality of sensor measurements and each of a plurality of failure modes of the first component; and (iii) for each failure mode of the first component, select a corresponding subset of the first plurality of sensor measurements determined to be most indicative of the failure mode; and
a data-driven model configured to evaluate the corresponding subsets of the plurality of sensor measurements in order to determine at least one of the plurality of failure modes.

20. The diagnostic engine of claim 19, further comprising:
a prognostic engine for predicting a remaining useful life of the first component based on the evaluation of the corresponding subsets; and
scheduling maintenance of the first component when the remaining useful life of the first component is less than a threshold value.

* * * * *